(12) United States Patent
Fowler et al.

(10) Patent No.: US 10,094,854 B2
(45) Date of Patent: Oct. 9, 2018

(54) MANIPULATOR IN AUTOMATIC TEST EQUIPMENT

(71) Applicant: Teradyne, Inc., North Reading, MA (US)

(72) Inventors: Gary Fowler, Newbury Park, CA (US); Vladimir Vayner, Needham, MA (US)

(73) Assignee: Teradyne, Inc., North Reading, MA (US)

( * ) Notice: Subject to any disclaimer, the term of this patent is extended or adjusted under 35 U.S.C. 154(b) by 6 days.

(21) Appl. No.: 14/921,557

(22) Filed: Oct. 23, 2015

(65) Prior Publication Data

US 2017/0115327 A1    Apr. 27, 2017

(51) Int. Cl.
*G01R 1/073*   (2006.01)
*G01R 1/04*    (2006.01)
*G01R 31/28*   (2006.01)

(52) U.S. Cl.
CPC ....... *G01R 1/07378* (2013.01); *G01R 1/0416* (2013.01); *G01R 31/2834* (2013.01); *G01R 31/2887* (2013.01)

(58) Field of Classification Search
None
See application file for complete search history.

(56) References Cited

U.S. PATENT DOCUMENTS

| | | | | |
|---|---|---|---|---|
| 4,943,020 A * | 7/1990 | Beaucoup | ................ | B23Q 1/48 248/123.11 |
| 5,528,158 A | 6/1996 | Sinsheimer et al. | | |
| 5,606,262 A * | 2/1997 | Montalbano | ............. | B25J 9/041 324/750.22 |
| 6,259,265 B1 | 7/2001 | Han et al. | | |
| 6,766,996 B1 * | 7/2004 | Somers | .............. | G01R 31/2887 248/123.11 |
| 6,888,343 B1 * | 5/2005 | Holt | ................... | G01R 31/2887 324/750.22 |
| 7,312,604 B2 * | 12/2007 | Trudeau | ............. | G01R 31/2887 324/750.22 |
| 7,383,746 B2 * | 6/2008 | Heigl | ................. | G01R 31/2891 324/750.22 |
| 7,528,620 B2 * | 5/2009 | Mochizuki | ......... | G01R 31/2887 324/756.03 |

(Continued)

FOREIGN PATENT DOCUMENTS

| | | |
|---|---|---|
| JP | 2000199776 A | 7/2000 |
| WO | WO-96/26446 A1 | 8/1996 |

OTHER PUBLICATIONS

International Search Report for PCT/US2016/048299, 3 pages (dated Nov. 25, 2016).

(Continued)

*Primary Examiner* — Paresh H Patel
(74) *Attorney, Agent, or Firm* — Choate, Hall & Stewart LLP

(57) ABSTRACT

An example manipulator for transporting a test head includes: a tower having a base and a track, with the track being vertical relative to the base; an arm to enable support for the test head, with the arm being connected to the track to move the test head vertically relative to the tower; one or more motors to drive movement of the arm along the track; and pneumatic cylinders to control movement of the arm to cause the test head to apply an amount of force to a peripheral device.

20 Claims, 11 Drawing Sheets

(56) References Cited

U.S. PATENT DOCUMENTS

| | | | | |
|---|---|---|---|---|
| 7,728,579 B2* | 6/2010 | Mueller | ............. | G01R 31/2887 |
| | | | | 324/750.25 |
| 8,212,578 B1* | 7/2012 | Gajda | ............... | G01R 31/2887 |
| | | | | 324/750.16 |
| 8,981,807 B2* | 3/2015 | West | ................. | G01R 31/2887 |
| | | | | 324/757.01 |
| 2004/0245982 A1* | 12/2004 | Heigl | ..................... | B23Q 1/56 |
| | | | | 324/750.25 |
| 2005/0020402 A1* | 1/2005 | Ny | .................... | G01R 31/2887 |
| | | | | 476/10 |
| 2006/0156836 A1* | 7/2006 | Ny | .................... | G01R 31/2887 |
| | | | | 73/866.5 |
| 2006/0255820 A1* | 11/2006 | Ramamoorthi | .... | G01R 31/2887 |
| | | | | 324/750.25 |
| 2008/0122432 A1* | 5/2008 | Mueller | ............. | G01R 31/2891 |
| | | | | 324/750.25 |
| 2011/0174098 A1* | 7/2011 | Weissacher | ........ | G01R 31/2887 |
| | | | | 74/89.23 |
| 2016/0186804 A1 | 6/2016 | Sinsheimer et al. | | |

OTHER PUBLICATIONS

Written Opinion for PCT/US2016/048299, 6 pages (dated Nov. 25, 2016).

International Preliminary Report on Patentability for PCT/US2016/048299, 7 pages (dated Apr. 24, 2016).

* cited by examiner

MANIPULATOR IN AUTOMATIC TEST EQUIPMENT

TECHNICAL FIELD

This specification relates generally to a manipulator for use in automatic test equipment (ATE).

BACKGROUND

Automatic test equipment (ATE) includes a test head, which houses test electronics to perform testing on a device under test (DUT). In some ATE, multiple DUTs are connected to a device interface board (DIB). The test head mates to the DIB in order to establish electrical connections to the DUTs and, through those connections, perform various tests. A manipulator is a device that transports the test head, and that brings the test head into contact with the DIB or other peripheral device that holds the DUTs. A certain amount of force is required to achieve contact between the test head and the DIB. However, too much force can damage the DIB and, possibly, the DUTs. Heretofore, springs were used in the manipulator to control the amount of force used to achieve contact between the test head and the DIB.

SUMMARY

An example manipulator for transporting a test head comprises: a tower having a base and a track, with the track being vertical relative to the base; an arm to enable support for the test head, with the arm being connected to the track to move the test head vertically relative to the tower; one or more motors to drive movement of the arm along the track; and pneumatic cylinders to control movement of the arm to cause the test head to apply an amount of force to a peripheral device. The example manipulator may also include one or more of the following features, either alone or in combination.

Each pneumatic cylinder may comprise: a housing to receive and to hold air generating air pressure; and a rod that is movable within the housing, with movement of the rod being affected by the air pressure. The example manipulator may include a controller that is settable to adjust the amount of force to be applied by the pneumatic cylinders by adjusting air pressure in one or more of the pneumatic cylinders. The example manipulator may include one or more processing devices to receive input based on a setting of the controller, and to control the amount of air pressure in the one or more of the pneumatic cylinders.

The example manipulator may include a reservoir to receive a hose for supplying air, with the reservoir comprising one or more conduits connecting the reservoir to the pneumatic cylinders for transferring the air to the pneumatic cylinders. The reservoir may comprise a check valve to receive the hose, with the check valve being configured to inhibit release of air upon removal of the hose from the check valve. The reservoir may comprise a gauge for displaying an air pressure of air in the reservoir. The example manipulator may include an air regulator, with the air regulator comprising a pressure release button, and with at least one of the reservoir or the pneumatic cylinders being responsive to selection of the pressure release button to release air from the at least one of the reservoir or the pneumatic cylinders.

There may be three pneumatic cylinders. The pneumatic cylinders may be mounted on a structure that is attached to, and configured to move along with, the arm along the track. The structure may comprise a first plate and a second plate. The pneumatic cylinders may be connected to the first plate and the second plate. Each of the pneumatic cylinders may comprise: a housing to receive and to hold air generating air pressure; and a rod that is movable within the housing and between the first plate and the second plate, with movement of the rod being affected by the air pressure to control movement of the arm.

The amount of force may be between 20 Newtons/millimeter (N/mm) and 60 N/mm. The pneumatic cylinders may be adjustable to support a test head having a weight within a range of 800 pounds (lbs) to 2600 lbs.

An example system comprises: a test head configured to interface to a device interface board (DIB) connected to a device under test (DUT), with the test head comprising electronics to test the DUT; and a manipulator to bring the test head into contact with the DIB. The manipulator comprises: an arm to enable support for the test head, with the arm being configured to move vertically relative to the DIB; one or more motors to drive vertical movement of the arm; and pneumatic cylinders to control movement of the arm to cause the test head to apply an amount of force to the DIB. The example manipulator may also include one or more of the following features, either alone or in combination.

Each pneumatic cylinder may comprise: a housing to receive and to hold air generating air pressure; and a rod that is movable within the housing, with movement of the rod being affected based on the air pressure. The manipulator may comprise a controller that is settable to adjust the amount of force to be applied by the pneumatic cylinders by adjusting air pressure in one or more of the pneumatic cylinders. The manipulator may comprise a reservoir to receive a hose for supplying air, with the reservoir comprising one or more conduits connecting the reservoir to the pneumatic cylinders for transferring the air to the pneumatic cylinders. The reservoir may comprise a check valve to receive the hose, with the check valve being configured to inhibit release of air upon removal of the hose from the check valve. The manipulator may comprise an air regulator, with the air regulator comprising a pressure release button, and with at least one of the reservoir or the pneumatic cylinders being responsive to selection of the pressure release button to release air from the at least one of the reservoir or the pneumatic cylinders.

The pneumatic cylinders may be mounted on a structure that is attached to, and configured to move along with, the arm along the track. The structure may comprise a first plate and a second plate. The pneumatic cylinders may be connected to the first plate and the second plate, with each of the pneumatic cylinders comprising: a housing to receive and to hold air generating air pressure; and a rod that is movable within the housing and between the first plate and the second plate, with movement of the rod being affected by the air pressure to control movement of the arm.

The amount of force may be between 20 Newtons/millimeter (N/mm) and 60 N/mm. The pneumatic cylinders may be adjustable to support a test head having a weight within a range of 800 pounds (lbs) to 2600 lbs.

Any two or more of the features described in this specification, including in this summary section, can be combined to form implementations not specifically described herein.

The test systems and techniques described herein, or portions thereof, can be implemented as/controlled by a computer program product that includes instructions that are stored on one or more non-transitory machine-readable storage media, and that are executable on one or more processing devices to control (e.g., coordinate) the operations described herein. The test systems and techniques described herein, or portions thereof, can be implemented as an apparatus, method, or electronic system that can include one or more processing devices and memory to store executable instructions to implement various operations.

The details of one or more implementations are set forth in the accompanying drawings and the description below. Other features and advantages will be apparent from the description and drawings, and from the claims.

DESCRIPTION OF THE DRAWINGS

Like reference numerals in different figures indicate like elements.

DETAILED DESCRIPTION

Described herein are example implementations of a manipulator for connecting a test head to a device under test (DUT). In some implementations, the DUT is connected to a device interface board (DIB), which provides an electrical and mechanical interface between the test head and the DUT. The manipulator brings the test head into contact with the DIB in order to form an electrical and mechanical connection between the two, and thereby enable communication between test electronics in the test head and the DUT. In the example implementations described herein, the manipulator includes pneumatic cylinders to control the amount of force with which the test head contacts the DIB (called the compliance force). The pneumatic cylinders are controllable to adjust the amount of that force, making them usable with test heads and DIBs that require different amounts of force. Thus, the manipulator described herein may be more flexible than manipulators that rely on springs to control the amount of force, since springs are not typically controllable to the extent that the pneumatic cylinders are controllable.

Figure 1:
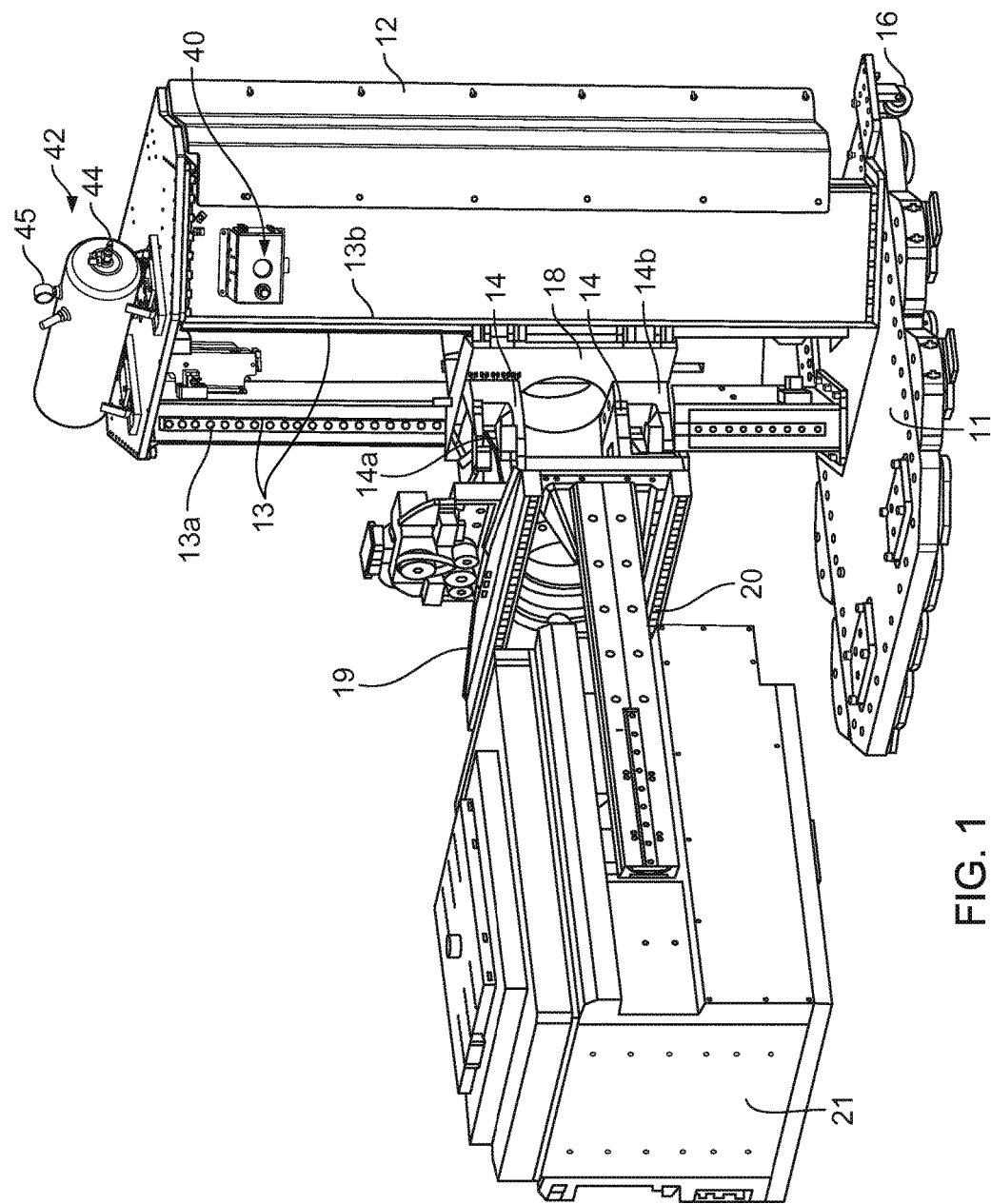
FIG. 1 is a perspective view of an example manipulator.
Figure 2:
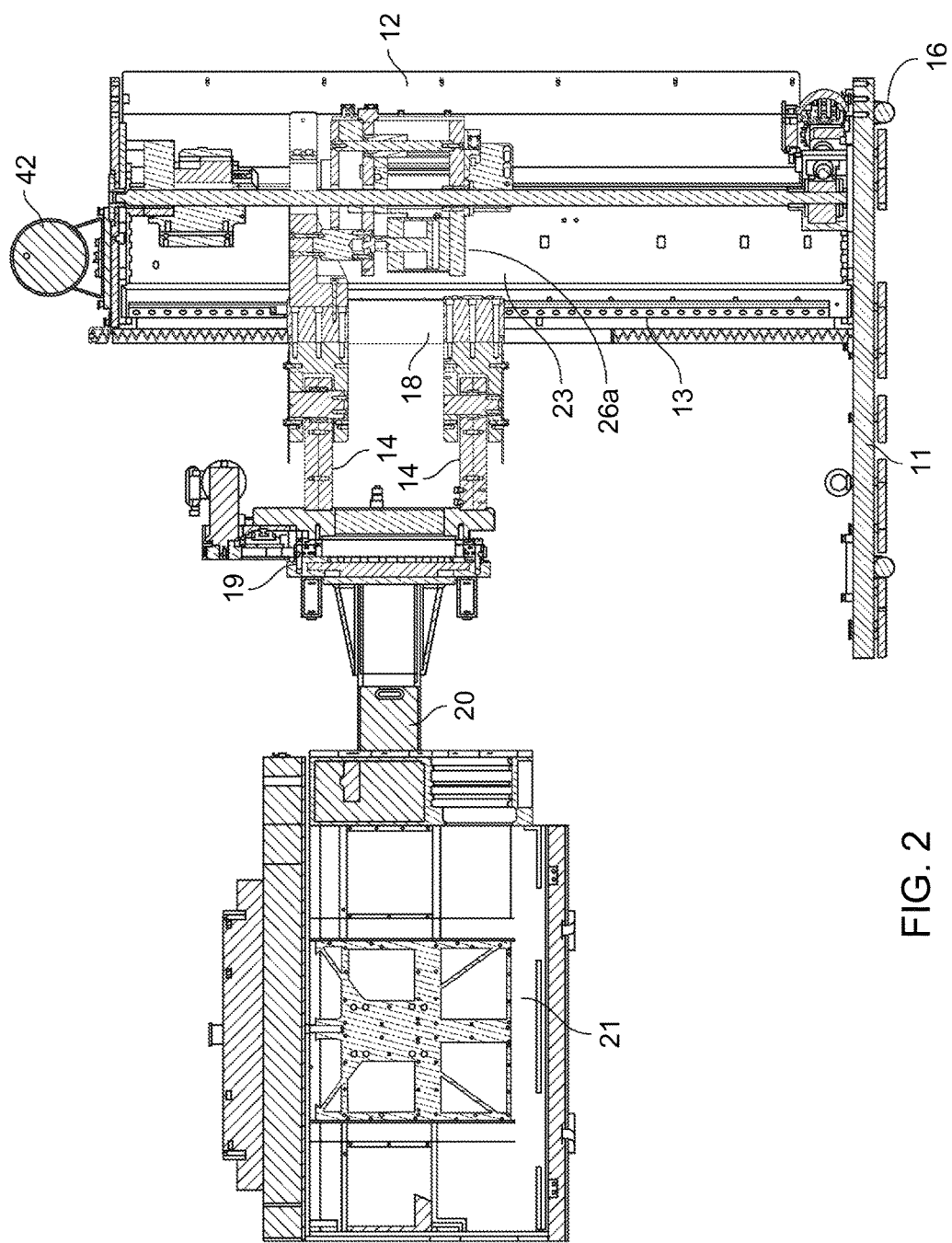
FIG. 2 is a cut-away, side view of the example manipulator.

FIGS. 1 and 2 show an example implementation of a manipulator 10. Manipulator 10 includes a base 11, a tower 12, tracks 13 (including track 13a and track 13b), and arms 14 (including arm 14a and arm 14b). In this example, tower 12 is fixed to base 11, and is not movable relative thereto. Base 11, however, is configured to move along a surface, such as the test room floor. In some implementations, base 11 is configured to move along tracks (not shown) on the test room floor. In some implementations, base 11 may include wheels (e.g., wheel 16) or other structures that enable movement along the test room floor. In some implementations, an air bearing may be enable movement along the test room floor. An example implementation an air bearing that may be incorporated into manipulator 10 is described in U.S. patent application Ser. No. 14/582,648, filed on Dec. 24, 2014, the contents of which are incorporated herein by reference.

Tower 12 includes two tracks 13a, 13b, one of which is on each side of the manipulator (track 13b is not wholly visible in FIG. 1 or FIG. 2). In some implementations, there may be more tracks (e.g., three or four tracks) or less tracks, e.g., a single track, as appropriate. Tracks 13a, 13b are arranged along a vertical length of tower 12, as shown in FIGS. 1 and 2. In some implementations, tracks 13a, 13b are arranged along the tower's entire vertical length, and in some implementations tracks 13a, 13b are arranged along only part of (e.g., less than the whole of) the tower's vertical length. Arms 14 are mounted on tracks 13 via a support structure 18. In this configuration, for example, the support structure is connected to the tracks, and the arms are connected to the support structure. The support structure is configured to move vertically along the tracks, thus also causing the arms to move vertically relative to the tracks. One or more motors (not shown) drive movement of the support structure, and thus the arms, along the tracks. Arms 14 are connected, via arrangement 19, to the test head holder 20.

Test head holder 20 is configured to hold a test head 21. Test head 21 is part of automatic test equipment (ATE). Test head 21 includes test electronics, such as pin electronics or the like, for use in testing a device under test (DUT) connected to the test head. As noted, in some implementations, a DUT is connected to a DIB, which provides electrical and mechanical connections between the DUT and the test head. To implement testing, the test head contacts, and connects to, the DIB. Different DIBs may require different amounts of force to make the appropriate connections. In operation, manipulator 10 is movable to align test head 21 to appropriate locations relative to the DIB, and to apply the appropriate amount of force to connect the test head to the DIB both electrically and mechanically.

Figure 3:
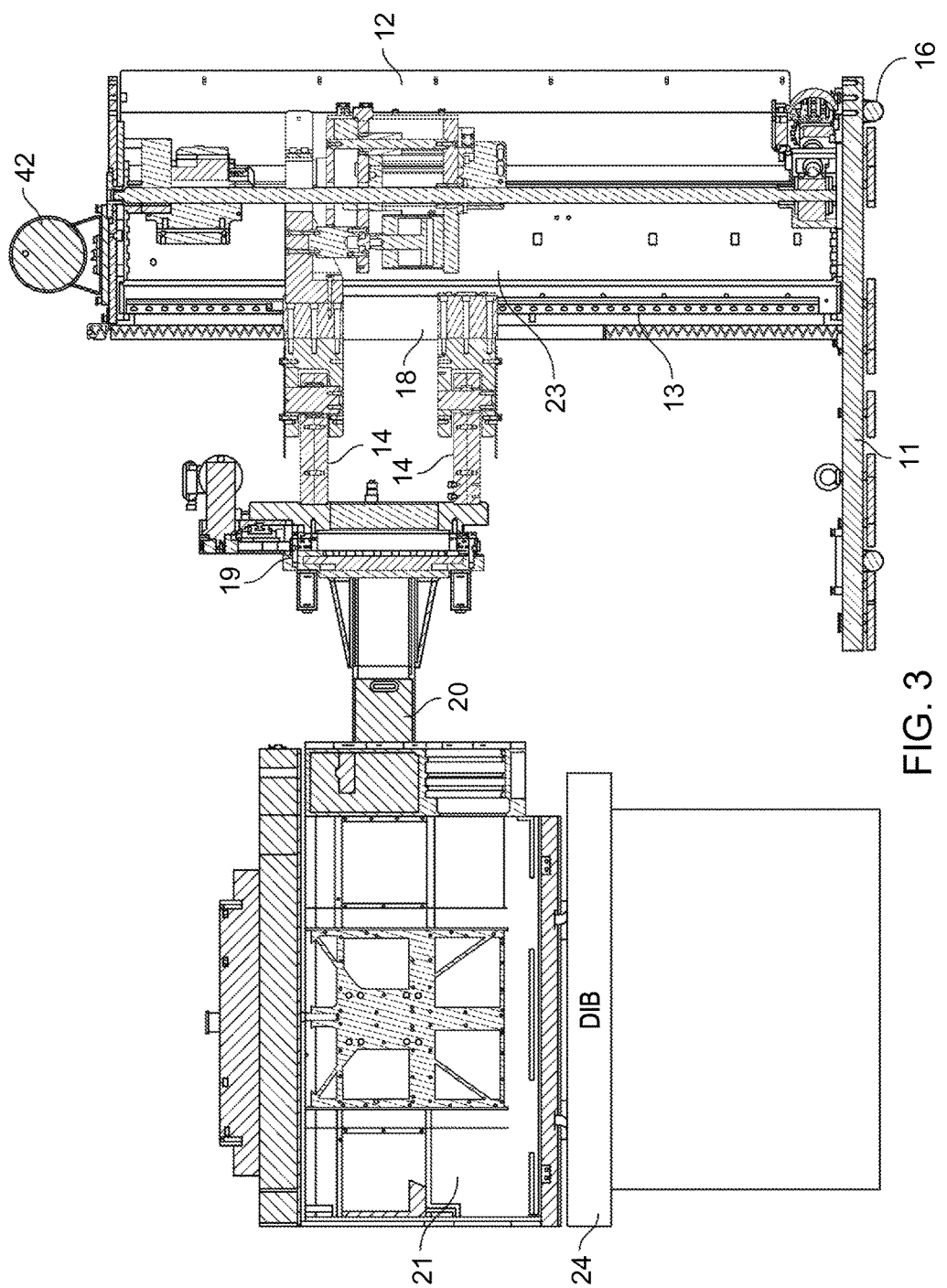
FIG. 3 is a cut-away, side view of the example manipulator connecting a test head to a device interface board (DIB).

In some implementations, vertical movement driven by the motors brings test head 21 into contact with the DIB. In some implementations, vertical movement driven by the motors brings test head into vertical alignment, but not necessarily contact, with the DIB. In either case, force is ultimately applied by pneumatic cylinders to connect the test head and the DIB. FIG. 3 shows an example in which test head 21 and DIB 26 are in contact.

Figure 4:
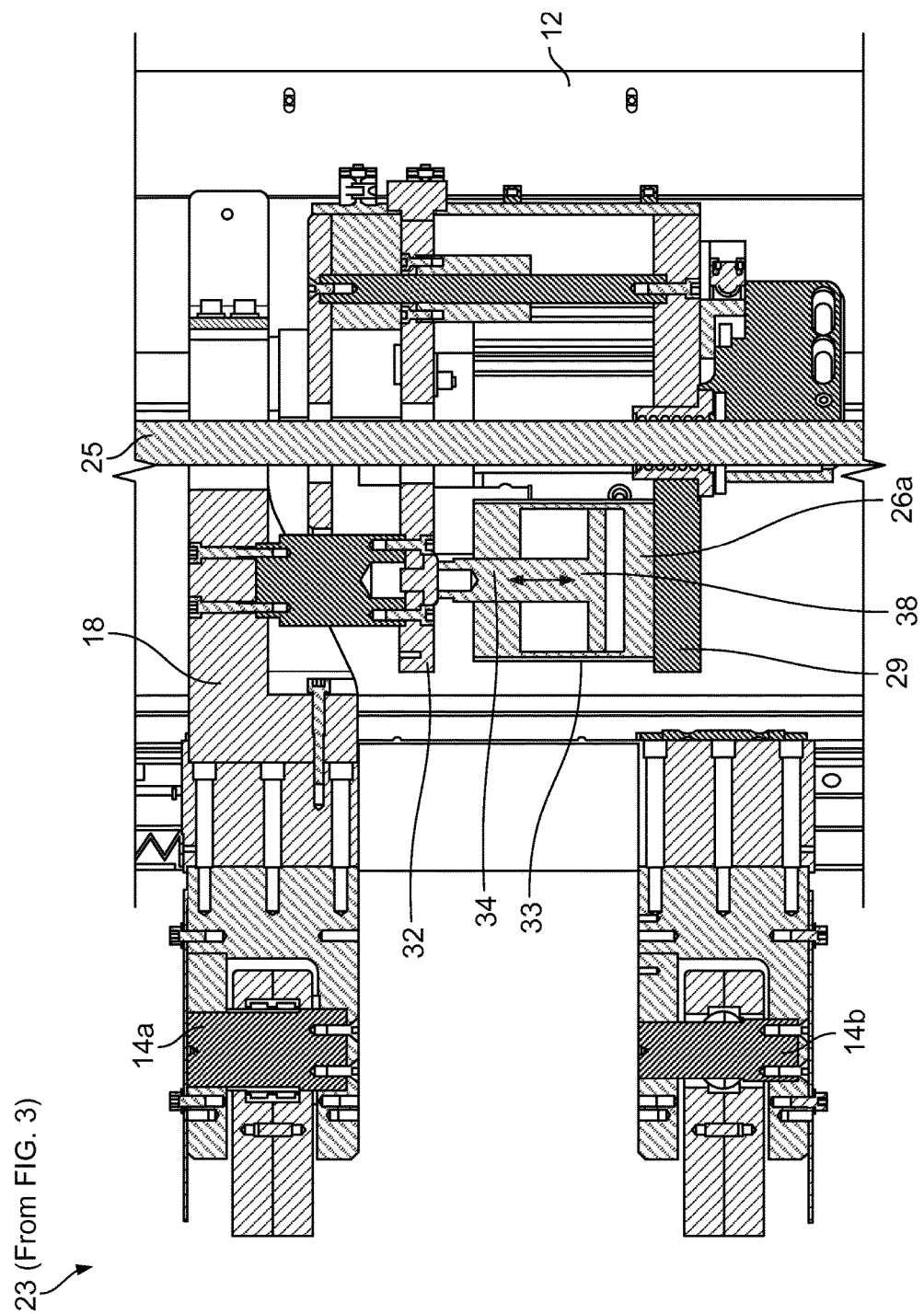
FIG. 4 is a close-up, cut-away, side view of a part the example manipulator that includes a pneumatic cylinder.
Figure 5:
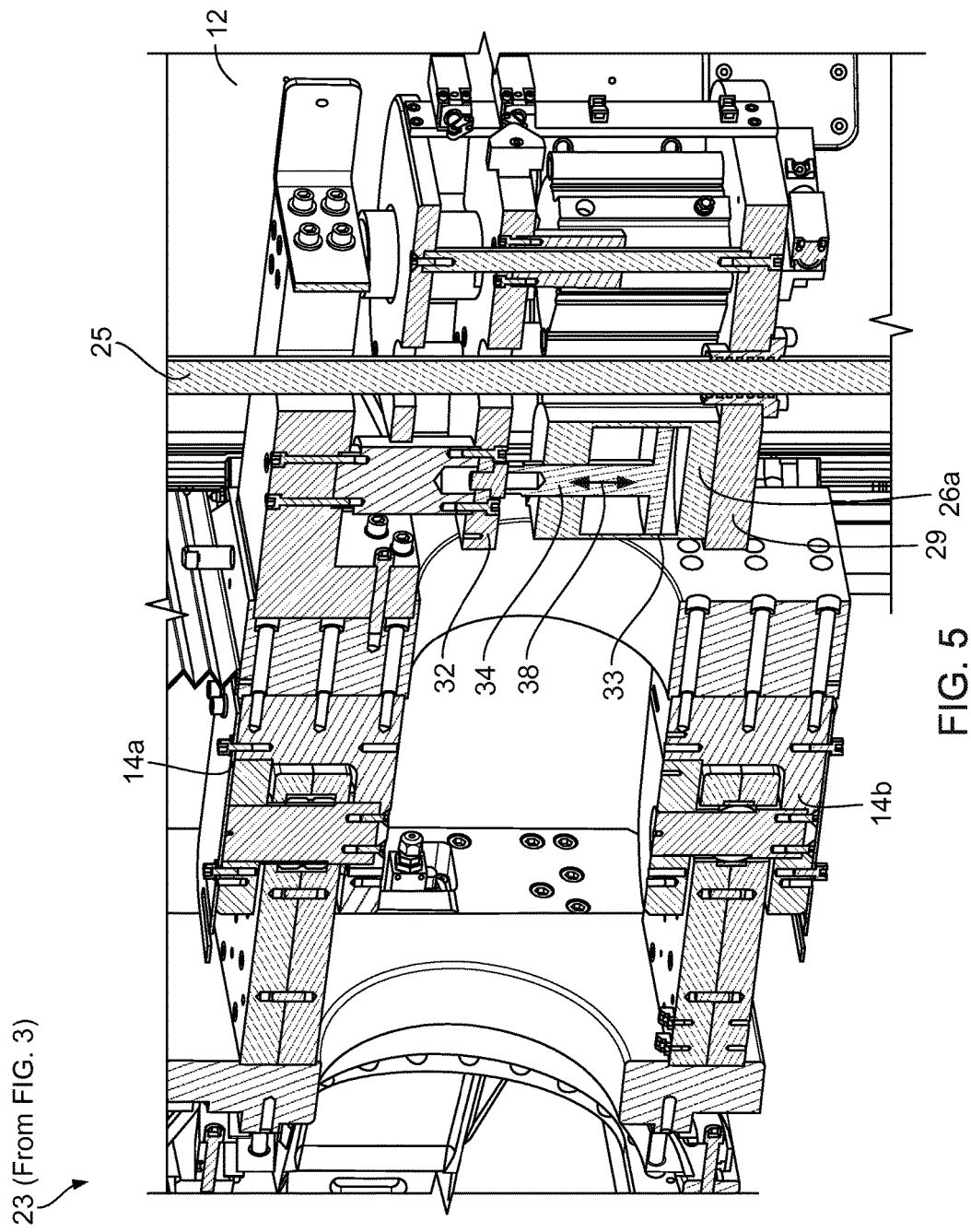
FIG. 5 is a close-up, cut-away, perspective view of a part the example manipulator that includes a pneumatic cylinder.

Referring also to FIGS. 4, 5, 6, and 7 (FIGS. 4 and 5 show close-up views of region 23 of FIG. 3), structure 18 is connected to, and configured to move along, lead screw or shaft 25, while following tracks 13a, 13b. In this example implementation, one or more motors (not shown) control this movement along the shaft/lead screw. The movement along shaft 25 and, and thus along tracks 13, may extend along the entire path of tower 12, or to whatever maximum extent is appropriate given the physical geometry. This movement thus enables the test head to be arranged, at an appropriate height, relative to a DIB or other structure to which the test head is to connect. In the example of FIGS. 1, 2 and 3, the DIB is below the test head; however, as noted, the manipulator described herein may be configured to mate the test head to a DIB that is above the test head.

Figure 6:
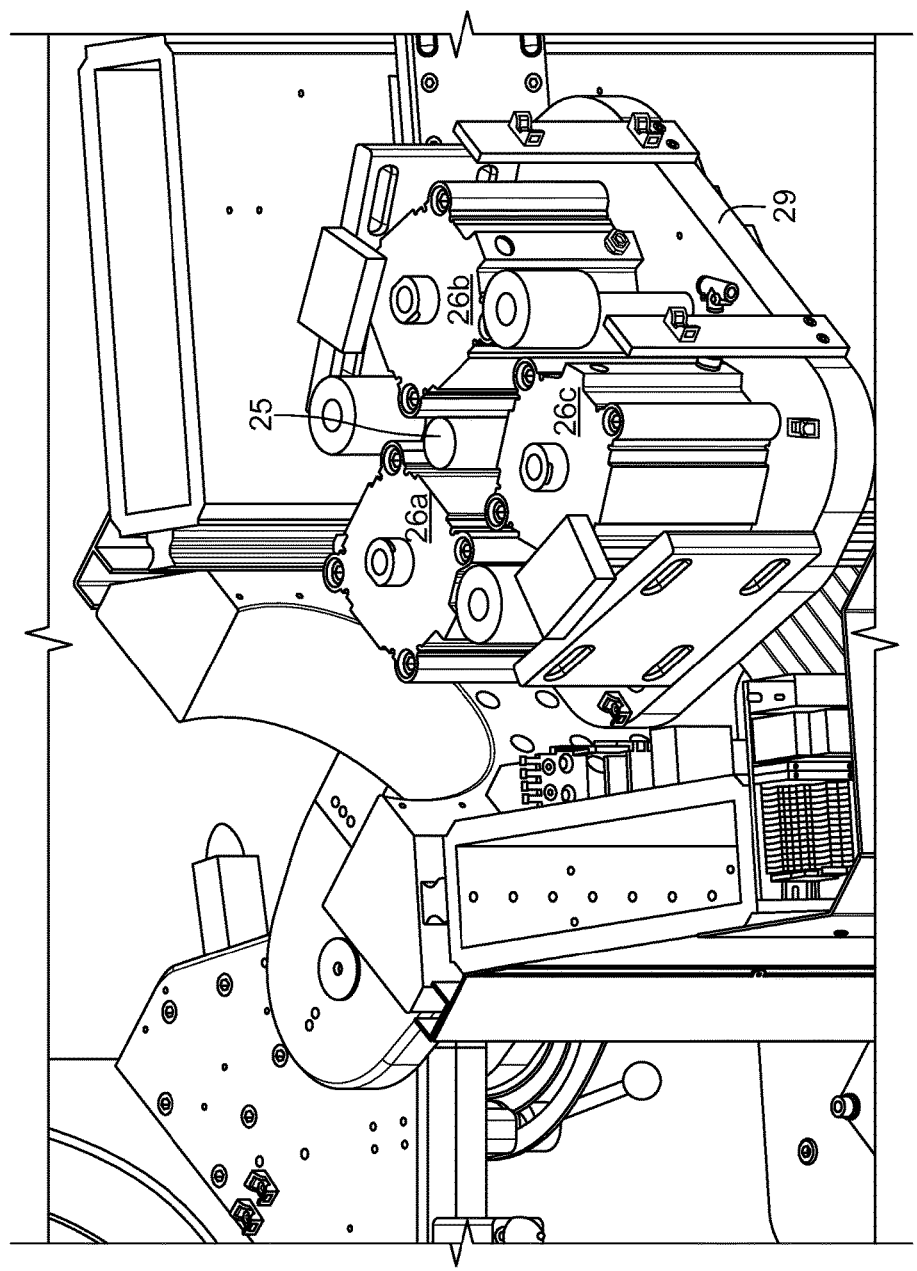
FIG. 6 is a close-up perspective view of a part the example manipulator that shows three pneumatic cylinders
Figure 7:
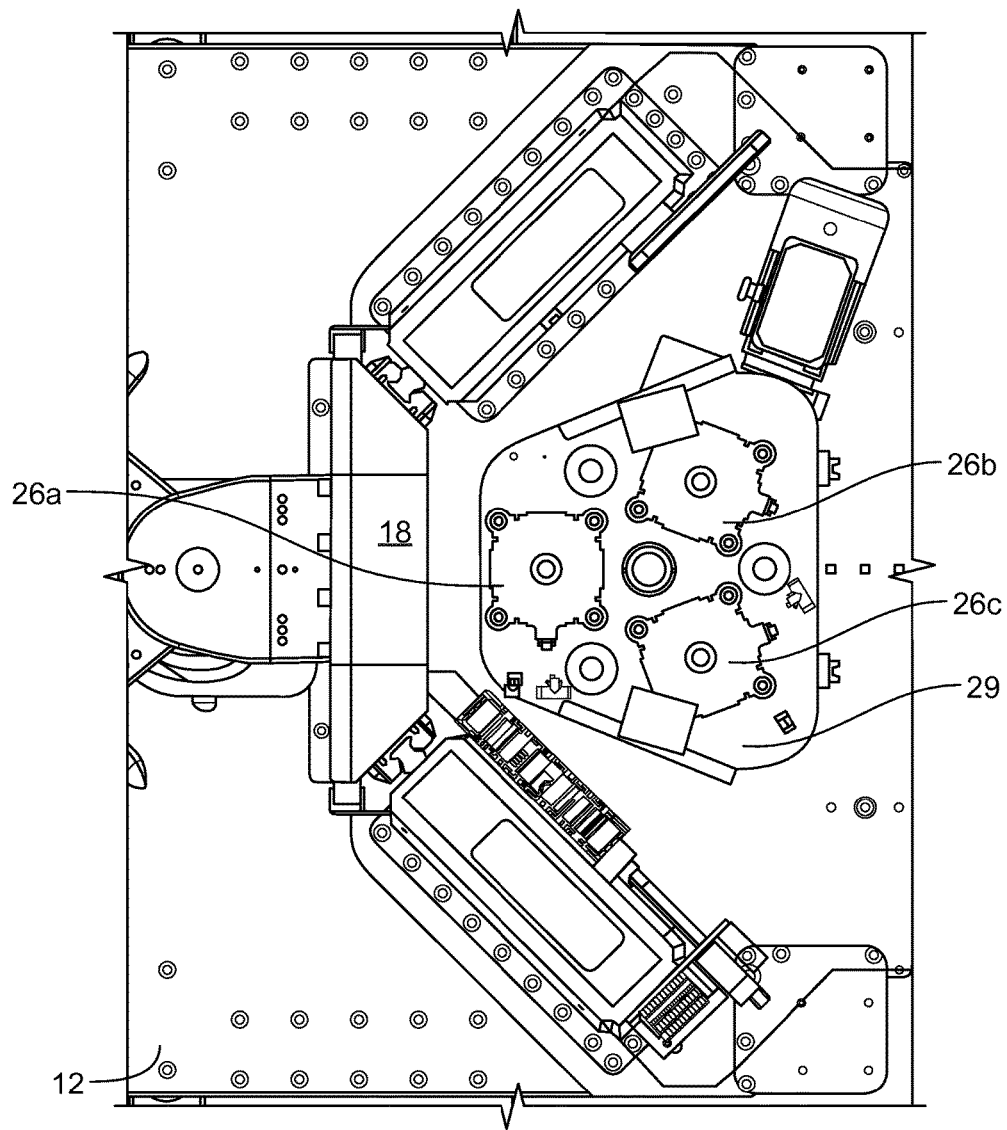
FIG. 7 is a close-up, cut-away, top view of a part the example manipulator that shows three pneumatic cylinders.
Figure 8:
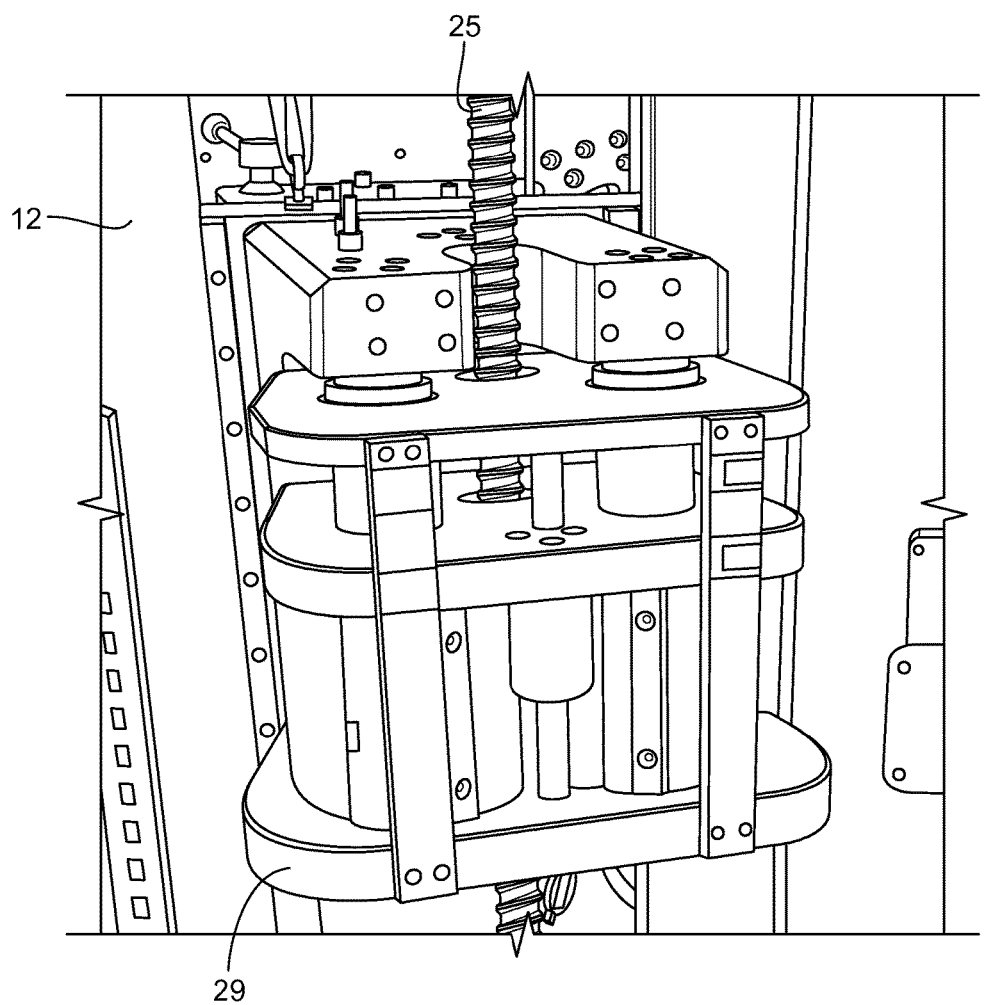
FIG. 8 is a close-up perspective of a part the example manipulator that shows three pneumatic cylinders from behind.

Referring to FIGS. 6 and 7, in some implementations, three pneumatic cylinders 26 (including pneumatic cylinders 26a, 26b, and 26c) are constructed and arranged to generate an appropriate amount of force (the compliance force) to connect the test head to the DIB. The compliance force is typically applied after the test head is moved into an appropriate location above or below the DIB. The manipulator is not limited to use with three pneumatic cylinders; any appropriate number of pneumatic cylinders may be used, e.g., one, two, three, four, five, six, and so forth. In the example implementations described herein, the force is applied downward by the manipulator to drive the test head to connect to the DIB. In some implementations, the force is applied upward by the manipulator to drive the test head to connect to the DIB. In some implementations, as noted, the connection is not made to a DIB, but rather to any other appropriate peripheral device.

The amount of force applied by the pneumatic cylinders is controllable to control movement of arms 14 and thus the test head. The resulting arm movement forces the test head against the DIB (or other peripheral device), thereby resulting in connection between the DIB and the test head. As shown in FIGS. 4 to 8, each pneumatic cylinder 26 is mounted to a plate 29 connected to, and movable with, support structure 18. Support structure 18 is also mounted to a lead screw or shaft 25 (in addition to its mounting on tracks 13), along which the motor(s) drive vertical movement of the support structure.

Figure 9:
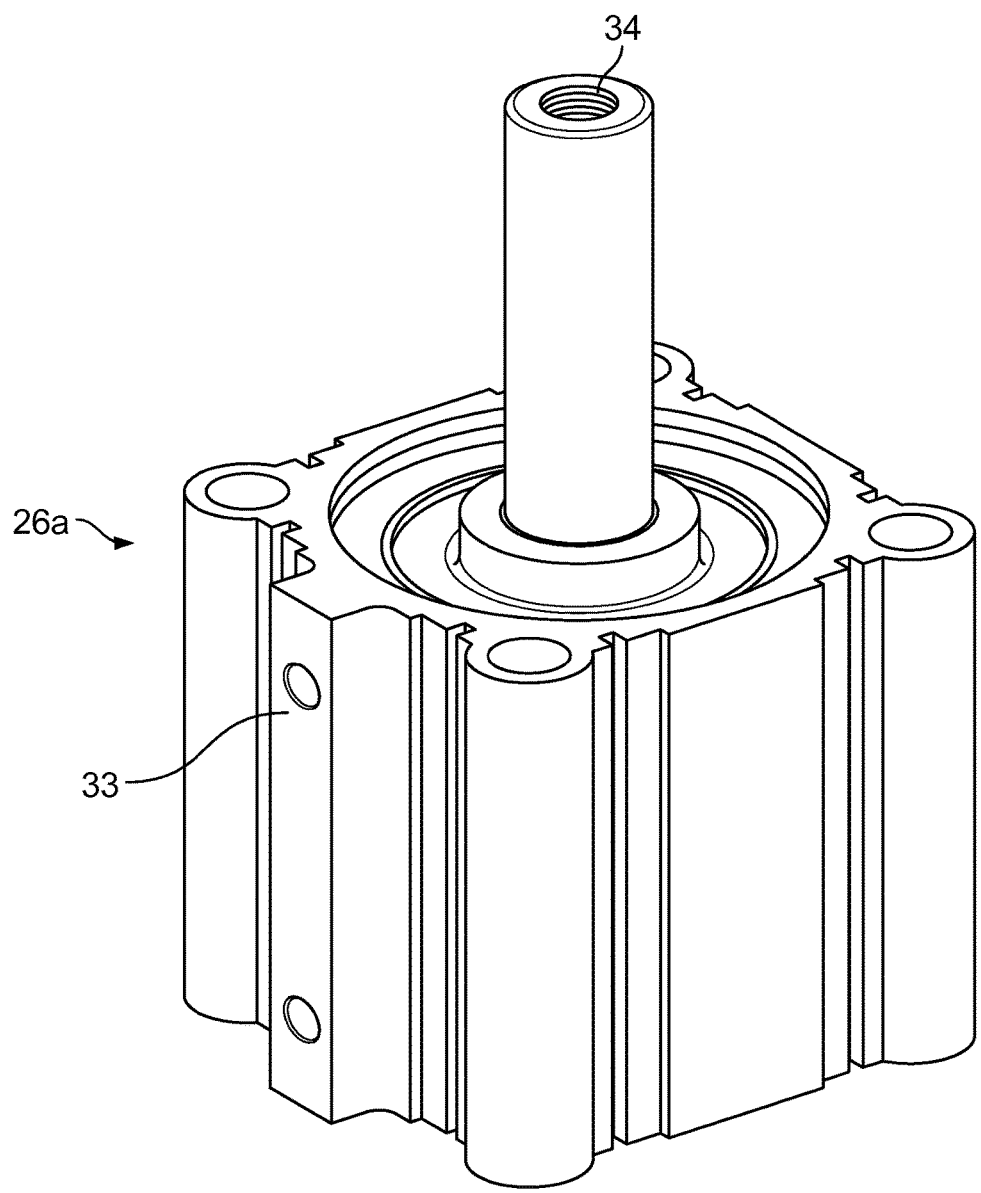
FIG. 9 is a perspective view of an example pneumatic cylinder.

Referring to FIGS. 4 and 5, the operation of pneumatic cylinders 26a is described. Pneumatic cylinders 26 are arranged relative to, and connected to, first plate 29 and second plate 32. In more detail, and referring also to FIG. 9, which shows an example pneumatic cylinder 26a, each of the pneumatic cylinders includes a housing 33 to receive and to hold air for generating air pressure; and a rod 34 that is movable within the housing and between the first plate and the second plate. The amount of air pressure in the housing corresponds to the amount of friction within the housing, and therefore affects how easily the rod moves within the housing.

Regarding operation of the pneumatic cylinders, in this example implementation, the pneumatic cylinders are connected in the same manner to plates 29 and 32. Accordingly, the connection and operation of only one of the pneumatic cylinders 26a is described. Housing 33 of pneumatic cylinder 26a is connected, and fixed, to plate 29. Rod 34 is connected to plate 32, which is likewise connected to arm 14a of structure 18. A motor (now shown) controls the vertical movement of rod 34, represented by arrow 38, within the housing of pneumatic cylinder 26a. As that vertical movement occurs, arms 14, which are connected together, and which are connected to rod 34 through plate 32 and structure 18, move vertically, e.g., either upward or downward relative to a horizontal surface, such as a test floor, on which the manipulator is located. This vertical movement is transferred to test head holder 20, and thus to test head 21. The force resulting from the vertical movement generated by the pneumatic cylinders forces test head 21 against the DIB, resulting in electrical and mechanical connection between the test head and the DIB.

In some implementations, the pneumatic cylinders are controllable and/or configurable to, as a group, apply a compliance force that is between 20 Newtons/millimeter (N/mm) and 60 N/mm. For example, the amount of compliance force may be 20 N/mm, 21 N/mm, 22 N/mm, 23 N/mm, 24 N/mm, 25 N/mm, 26 N/mm, 27 N/mm, 28 N/mm, 29 N/mm, 30 N/mm, 31 N/mm, 32 N/mm, 33 N/mm, 34 N/mm, 35 N/mm, 36 N/mm, 37 N/mm, 38 N/mm, 39 N/mm, 40 N/mm, 41 N/mm, 42 N/mm, 43 N/mm, 44 N/mm, 45 N/mm, 46 N/mm, 47 N/mm, 48 N/mm, 49 N/mm, 50 N/mm, 51 N/mm, 52 N/mm, 53 N/mm, 54 N/mm, 55 N/mm, 5 N/mm, 57 N/mm, 58 N/mm, 59 N/mm, or 60 N/mm. However, the pneumatic cylinders are not limited to applying amounts of compliance forces within this range or to these specific force values, and may be configured to apply any appropriate amount of compliance force that is appropriate for a particular geometry or size.

In some implementations, the pneumatic cylinders are controllable and/or configurable to support a test head having a weight within a range of 800 pounds (lbs) to 2600 lbs. For example the test head may weight 800 lbs, 900 lbs, 1000 lbs, 1100 lbs, 1200 lbs, 1300 lbs, 1400 lbs, 1500 lbs, 1600 lbs, 1700 lbs, 1800 lbs, 1900 lbs, 2000 lbs, 2100 lbs, 2200 lbs, 2300 lbs, 2400 lbs, 2500 lbs, or 2600 lbs. However, the pneumatic cylinders are not limited to supporting a test head having weights within this range or to these specific values, and may be configured to support a test head having any appropriate weight given the geometry or size of the manipulator.

In this regard, each pneumatic cylinder can be controlled and/or configured by adjusting the amount of air pressure held in its housing. For example, referring to pneumatic cylinder 26a (FIG. 9), housing 33 holds air at a specified pressure. An amount of air may be introduced into the housing to generate that air pressure. Rod 34 is movable within the housing, as described herein. The movement of rod 34 is affected by the pressure within the housing. For example, in some implementations, the higher the air pressure is in the housing, the more difficult movement of rod 34 will be, resulting in more applied force by the cylinder. Likewise, in some implementations, the lower the air pressure is in the housing, the less difficult movement of rod 34 will be, resulting in less applied force by the cylinder. In this regard, low/high, more/less, and relative words in general do not have any specific numerical connotations, but rather indicate relative states.

Figure 10:
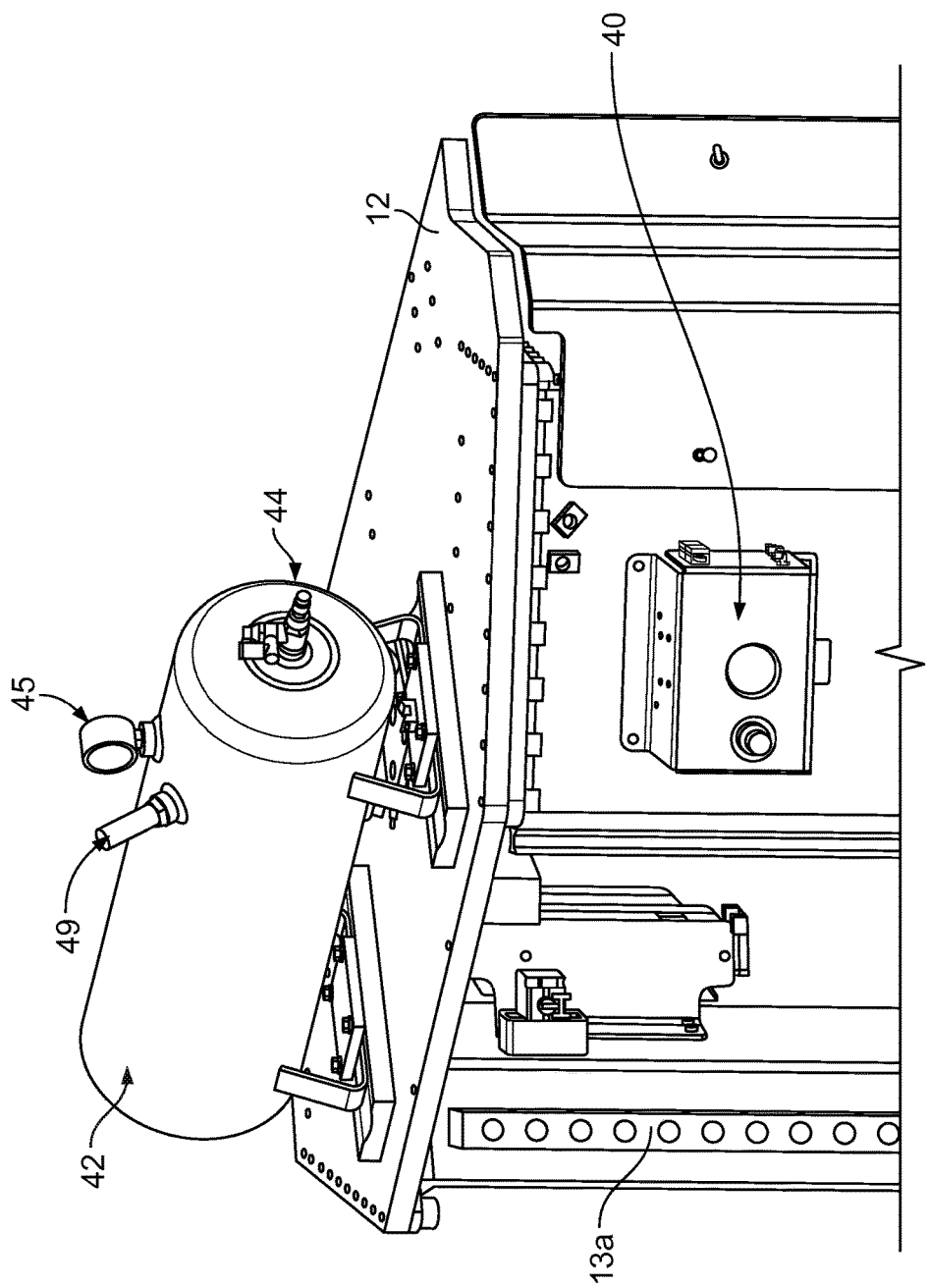
FIG. 10 is a close-up perspective view of a part the example manipulator that shows an air reservoir.

In some implementations, referring to FIGS. 1 and 10, manipulator 10 includes a controller 40 that is settable to adjust the amount of force to be applied by the pneumatic cylinders by adjusting air pressure in one or more of (e.g., all of) the pneumatic cylinders. The controller may be computer-controlled, e.g., it may be controlled using a test computer or other processing device(s) that is/are part of the ATE. For example, one or more processing devices may receive input based on a setting of the controller, and output control signals to control the amount of air pressure in the one or more of the pneumatic cylinders. In this regard, the air pressure of individual pneumatic cylinders may be controlled to have the same or different air pressures, or the pneumatic cylinders may be controlled as a group to have the same air pressure.

Air may be introduced to the pneumatic cylinders via an air reservoir 42 (as shown in FIGS. 1, 2, and 10). Reservoir 42 may be configured to receive (e.g., to connect to) a hose supplying air. The hose may be, e.g., available from the test room or other appropriate air source. The reservoir may include one or more conduits connecting the reservoir to the pneumatic cylinders for transferring the air to the pneumatic cylinders, as appropriate. For example, there may be a separate conduit to each pneumatic cylinder, thereby enabling individual control over the air pressure therein, or there may be a common conduit connected to all three pneumatic cylinders, allowing for common control over the air pressure therein.

The reservoir may include a check valve 44 to receive the hose. The check valve may be configured to inhibit release of air upon removal of the hose from the check valve, thereby preventing undesired air streams in the test environment. The reservoir may also include a gauge 45 for displaying an air pressure of air in reservoir 42. In some implementations, the controller is an air regulator that is mounted on tower 12, as shown in FIGS. 1 and 10. In some implementations, the air regulator includes a pressure release button. The reservoir and/or the pneumatic cylinders may be responsive to selection of the pressure release button to release air therefrom, and depressurize wholly or partly, depending, e.g., on how much air that the pressure release button is configured to release, and on how long that button is selected. The reservoir may include a pressure release valve 49.

Figure 11:
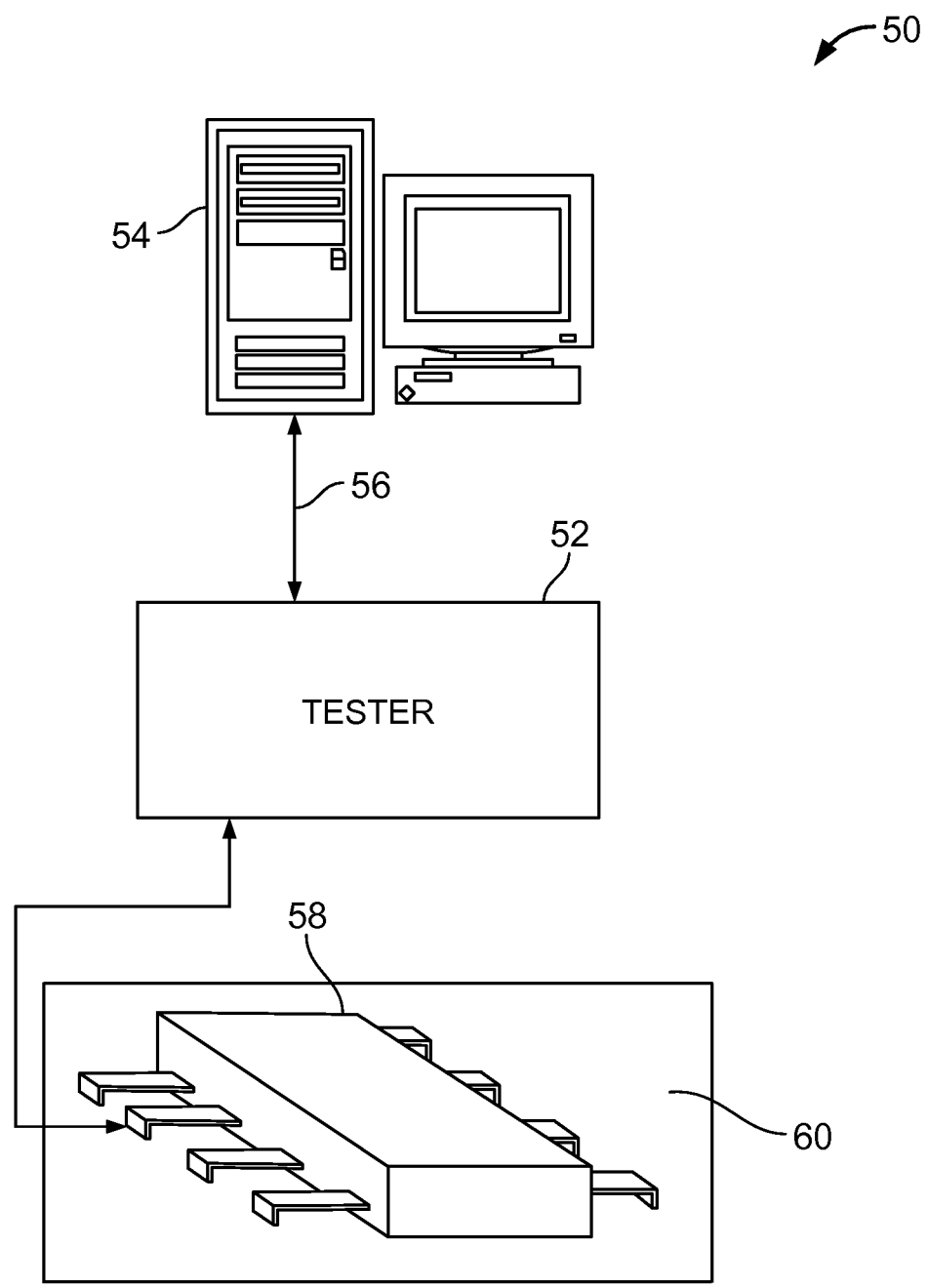
FIG. 11 is a block diagram of example automatic test equipment (ATE) that may be used with the example manipulator.

Referring to FIG. 11, an example ATE 50 for testing a DUT 58 includes a tester (or "test instrument") 52, which is part of the test head. The test head may be interfaced to a DIB 60 using the manipulator described herein Tester 52 may include a number of channels. To control tester 52, system includes a computer system 54 that interfaces with tester 52 over one or more electrical connections 56. In an example operation, computer system 54 sends commands to tester 52 to initiate execution of routines and functions for testing DUT 58. Such executing test routines may initiate the generation and transmission of test signals to the DUT 58 and collect responses from the DUT. Various types of DUTs may be tested by system 50. In some implementations, the DUTs may be RF, microwave, or other wireless devices. In some implementations, the DUT may be any appropriate semiconductor or other device, such as an integrated circuit (IC) chip (e.g., memory chip, microprocessor, analog-to-digital converter, digital-to-analog converter, etc.) or other devices.

To provide test signals and collect responses from the DUT, 52 is connected to an interface to the internal circuitry of DUT 58. For example, the DUT may be inserted into a socket in DIB 60, and which contains interfaces to electrical connections between the DUT and an instrument module in the tester. The tester is interfaced to the DIB using the manipulator described herein.

While this specification describes example implementations related to "testing" and a "test system," the devices and methods described herein may be used in any appropriate system, and are not limited to test systems or to the example test systems described herein.

Testing, including control over the manipulator, performed as described herein may be implemented and/or controlled using hardware or a combination of hardware and software. For example, a test system like the ones described herein may include various controllers and/or processing devices located at various points. A central computer may coordinate operation among the various controllers or processing devices. The central computer, controllers, and processing devices may execute various software routines to effect control and coordination of testing and calibration.

Testing, including control over the manipulator, can be controlled, at least in part, using one or more computer program products, e.g., one or more computer program tangibly embodied in one or more information carriers, such as one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the testing and calibration can be performed by one or more programmable processors executing one or more computer programs to perform the functions described herein. All or part of the testing and calibration can be implemented using special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer (including a server) include one or more processors for executing instructions and one or more storage area devices for storing instructions and data. Generally, a computer will also include, or be operatively coupled to receive data from, or transfer data to, or both, one or more machine-readable storage media, such as mass PCBs for storing data, e.g., magnetic, magneto-optical disks, or optical disks. Machine-readable storage media suitable for embodying computer program instructions and data include all forms of non-volatile storage area, including by way of example, semiconductor storage area devices, e.g., EPROM, EEPROM, and flash storage area devices; magnetic disks, e.g., internal hard disks or removable disks; magneto-optical disks; and CD-ROM and DVD-ROM disks.

Any "electrical connection" as used herein may imply a direct physical connection or a connection that includes intervening components but that nevertheless allows electrical signals to flow between connected components. Any "connection" involving electrical circuitry mentioned herein, unless stated otherwise, includes an electrical connection and not necessarily a direct physical connection regardless of whether the word "electrical" is used to modify "connection". Any "connection" between structural components as used herein may imply a direct physical connection or a physical connection that includes intervening one or more intervening components or other structures.

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

What is claimed is:

1. A manipulator for transporting a test head, comprising:
a tower having a base and a track, the track being vertical relative to the base;
an arm to enable support for the test head, the arm being connected to the track to move the test head vertically relative to the tower;
one or more motors, coupled to the arm, to drive movement of the arm along the track; and
pneumatic cylinders, coupled to the arm, to control movement of the arm to cause the test head to apply a compliance force in a direction of an interface device to cause the test head to connect to the interface device.

2. The manipulator of claim 1, wherein each pneumatic cylinder comprises:
a housing to receive and to hold air for generating air pressure; and
a rod that is movable within the housing, movement of the rod being affected by the air pressure.

3. The manipulator of claim 1, further comprising:
a controller that is settable to adjust an amount of the compliance force to be applied by the pneumatic cylinders by adjusting air pressure in one or more of the pneumatic cylinders.

4. The manipulator of claim 3, further comprising:
one or more processing devices to receive input based on a setting of the controller, and to control an amount of air pressure in the one or more of the pneumatic cylinders.

5. The manipulator of claim 1, further comprising:
a reservoir to receive a hose for supplying air, the reservoir comprising one or more conduits connecting the reservoir to the pneumatic cylinders for transferring the air to the pneumatic cylinders.

6. The manipulator of claim 5, wherein the reservoir comprises a check valve to receive the hose, the check valve being configured to inhibit release of air upon removal of the hose from the check valve.

7. The manipulator of claim 5, wherein the reservoir comprises a gauge for displaying a pressure of air in the reservoir.

8. The manipulator of claim 5, further comprising:
an air regulator comprising a pressure release button, at least one of the reservoir or the pneumatic cylinders being responsive to selection of the pressure release button to release air from the at least one of the reservoir or the pneumatic cylinders.

9. The manipulator of claim 1, wherein there are three pneumatic cylinders.

10. The manipulator of claim 1, wherein the pneumatic cylinders are mounted on a structure that is attached to, and configured to move along with, the arm along the track, the structure comprising:
a first plate; and
a second plate;
wherein the pneumatic cylinders are connected to the first plate and the second plate, each of the pneumatic cylinders comprising:
a housing to receive and to hold air generating air pressure; and
a rod that is movable within the housing and between the first plate and the second plate, movement of the rod being affected by the air pressure to control movement of the arm.

11. The manipulator of claim 1, wherein an amount of the compliance force is between 20 Newtons/millimeter (N/mm) and 60 N/mm.

12. The manipulator of claim 1, wherein the pneumatic cylinders are adjustable to support a test head having a weight within a range of 800 pounds (lbs) to 2600 lbs.

13. A system comprising:
a test head configured to interface to a device interface board (DIB) connected to a device under test (DUT), the test head comprising electronics to test the DUT; and
a manipulator that is connectable to the test head to bring the test head into contact with the DIB, the manipulator comprising:
an arm to enable support for the test head, the arm being configured to move vertically relative to the DIB;
one or more motors, coupled to the arm, to drive vertical movement of the arm; and
pneumatic cylinders, coupled to the arm, to control movement of the arm to cause the test head to apply a compliance force in a direction of the DIB to cause the test head to connect to the DIB.

14. The system of claim 13, wherein each pneumatic cylinder comprises:
a housing to receive and to hold air generating air pressure; and
a rod that is movable within the housing, movement of the rod being affected based on the air pressure.

15. The system of claim 13, wherein the manipulator comprises:
a controller that is settable to adjust an amount of the compliance force to be applied by the pneumatic cylinders by adjusting air pressure in one or more of the pneumatic cylinders.

16. The system of claim 13, wherein the manipulator comprises:
a reservoir to receive a hose for supplying air, the reservoir comprising one or more conduits connecting the reservoir to the pneumatic cylinders for transferring the air to the pneumatic cylinders.

17. The system of claim 16, wherein the reservoir comprises a check valve to receive the hose, the check valve being configured to inhibit release of air upon removal of the hose from the check valve.

18. The system of claim 16, wherein the manipulator comprises:
an air regulator, the air regulator comprising a pressure release button, at least one of the reservoir or the pneumatic cylinders being responsive to selection of the pressure release button to release air from the at least one of the reservoir or the pneumatic cylinders.

19. The system of claim 13, wherein the pneumatic cylinders are mounted on a structure that is attached to, and configured to move along with, the arm along the track, the structure comprising:
a first plate; and
a second plate;
wherein the pneumatic cylinders are connected to the first plate and the second plate, each of the pneumatic cylinders comprising:
a housing to receive and to hold air generating air pressure; and
a rod that is movable within the housing and between the first plate and the second plate, movement of the rod being affected by the air pressure to control movement of the arm.

20. The system of claim 13, wherein an amount of the compliance force is between 20 Newtons/millimeter (N/mm) and 60 N/mm; and
wherein the pneumatic cylinders are adjustable to support a test head having a weight within a range of 800 pounds (lbs) to 2600 lbs.

* * * * *